(12) United States Patent
Aziz et al.

(10) Patent No.: US 7,916,822 B2
(45) Date of Patent: Mar. 29, 2011

(54) METHOD AND APPARATUS FOR REDUCING LATENCY IN A CLOCK AND DATA RECOVERY (CDR) CIRCUIT

(75) Inventors: Pervez M. Aziz, Dallas, TX (US); Gregory W. Sheets, Bangor, PA (US)

(73) Assignee: Agere Systems Inc., Allentown, PA (US)

( * ) Notice: Subject to any disclaimer, the term of this patent is extended or adjusted under 35 U.S.C. 154(b) by 1239 days.

(21) Appl. No.: 11/367,214

(22) Filed: Mar. 3, 2006

(65) Prior Publication Data

US 2007/0206711 A1 Sep. 6, 2007

(51) Int. Cl.
*H03D 3/24* (2006.01)

(52) U.S. Cl. ........ 375/373; 375/354; 375/370; 375/371; 375/375; 375/377; 370/540

(58) Field of Classification Search .......... 375/371–377, 375/259, 260, 293, 316, 327, 342, 344–347, 375/354–355, 362, 370, 219, 220, 295
See application file for complete search history.

(56) References Cited

U.S. PATENT DOCUMENTS

| | | | |
|---|---|---|---|
| 6,208,671 B1 * | 3/2001 | Paulos et al. | 370/545 |
| 6,307,906 B1 * | 10/2001 | Tanji et al. | 375/376 |
| 6,636,120 B2 | 10/2003 | Bhakta et al. | |
| 6,995,618 B1 * | 2/2006 | Boecker | 331/16 |
| 7,421,050 B2 | 9/2008 | Aziz et al. | |
| 7,587,012 B2 * | 9/2009 | Evans et al. | 375/354 |
| 7,742,507 B1 * | 6/2010 | Kurowski et al. | 370/540 |
| 2001/0031028 A1 * | 10/2001 | Vaucher | 375/355 |
| 2002/0075980 A1 * | 6/2002 | Tang et al. | 375/372 |
| 2004/0141567 A1 * | 7/2004 | Yang et al. | 375/287 |
| 2006/0029172 A1 * | 2/2006 | Andreotti et al. | 375/354 |
| 2006/0146959 A1 | 7/2006 | Aziz et al. | |
| 2006/0159211 A1 * | 7/2006 | Lin | 375/355 |
| 2007/0285176 A1 * | 12/2007 | North | 331/8 |

* cited by examiner

*Primary Examiner* — Shuwang Liu
*Assistant Examiner* — Hirdepal Singh

(57) ABSTRACT

Disclosed is a system and method for a clock and data recovery (CDR) circuit. A phase selection circuit (PSC) generates a signal comprising frequency and phase. A voltage controlled oscillator (VCO) connected to the PSC generates a clock signal. The clock signal controls the frequency of the signal. The CDR circuit also includes a phase adjustment signal generator connected to the PSC for generating a phase adjustment signal. The phase adjustment signal controls the phase of the signal.

25 Claims, 7 Drawing Sheets

US 7,916,822 B2

METHOD AND APPARATUS FOR REDUCING LATENCY IN A CLOCK AND DATA RECOVERY (CDR) CIRCUIT

BACKGROUND OF THE INVENTION

The present invention relates generally to clock and data recovery (CDR) circuits, and more specifically to reducing the latency associated with a CDR circuit.

Clock and data recovery (CDR) operations are performed in many communication circuits. Digital communication receivers sample an analog waveform and then detect the sampled data. The phase of the analog waveform is typically unknown and there may be a frequency offset between the frequency at which the original data was transmitted and the nominal receiver sampling clock frequency. The CDR circuit is used to sample an analog waveform such that when the sampled waveform is passed through a data detector, the data is recovered properly despite the fact that the phase and frequency of the transmitted signal is unknown.

FIG. 1 shows a prior art serializer/deserializer (also referred to as a Serdes) communication macrocell 100. The macrocell 100 includes multiple channels, such as a first channel (i.e., channel 0) 104, a second channel (i.e., channel 1) 106, and a (P−1)th channel (i.e., channel P) 108. Each channel performs its own CDR function. A common reference clock generation circuit 110 provides a reference clock signal (REFCLK) 112 to each of the channels 104-108, which is used to sample a respective analog waveform 114a, 114b, 114c. The CDR circuit adjusts the phase and frequency of the reference clock 112 to produce a modified clock signal (also referred to as a recovered sampling clock signal) 118a, 118b, 118c. The modified clock signal 118a, 118b, 118c can sample the respective analog waveform 114a, 114b, 114c to allow proper data detection. When a data detector 122a, 122b, 122c reaches its steady state, then the respective analog signal 114a, 114b, 114c is sampled correctly and the corresponding data detector 122a, 122b, 122c transmits recovered/retimed data 126a, 126b, 126c as its output.

Each of the data detectors 122a, 122b, 122c can be a decision device based on an amplitude threshold or a more complicated detector such as a sequence detector. As a CDR circuit is replicated multiple times, area and power efficiency of the CDR hardware are often critical.

FIG. 2 shows a block diagram of a traditional analog CDR circuit 200 using a VCO. The CDR circuit 200 receives an analog signal 202 as input. The CDR circuit 200 includes a data detector 204, phase detector 208, analog loop filter 212, and one or more circuits to change the sampling phase with which the data detector input is sampled. The data detector 204 produces recovered/retimed data 214.

One circuit commonly used to change the sampling phase is a voltage controlled oscillator (VCO) 216. The output of the VCO 216 is a recovered sampling clock 220. As the CDR circuit 200 is a closed-loop system, the recovered sampling clock 220 is used to adjust the sampling of the analog signal 202. A VCO 216 changes its output clock frequency continually to accommodate any difference in phase and frequency with respect to the received analog signal 202.

One drawback of the CDR circuit 200 is that the analog loop filter 212 consumes a lot of area on the integrated circuit chip on which the CDR circuit 200 is designed. For example, the analog loop filter 212 is built with many chips or is built with particular chips that consume a large amount of surface area on the integrated circuit chip.

FIG. 3 shows a CDR circuit having another circuit commonly used to change the sampling phase—a phase selection circuit (PSC) 302. A PSC may be implemented as a multiplexer, a voltage controlled delay line (VCDL), or a current controlled delay line (CCDL). A PSC changes its output phase continually to accommodate any difference in phase and frequency with respect to the received analog signal.

The circuit 300 includes a data detector 303, a phase detector 304, and a traditional digital loop filter 305 that can be used in conjunction with PSC 302. The PSC 302 continually adjusts the phase of reference clock (i.e., REFCLK) 312 to effectively modify its phase and/or frequency to produce a recovered sampling clock 316. The recovered sampling clock 316 is used to sample analog signal 324.

Digital loop filters, such as digital loop filter 305, often consume less chip area then an analog loop filter. Digital loop filters, however, typically introduce more latency into the CDR circuit relative to their analog counterpart.

Therefore, there remains a need to retain the circuit area benefit achieved from a digital loop filter while reducing the latency introduced into a CDR circuit by the digital loop filter.

BRIEF SUMMARY OF THE INVENTION

In accordance with the present invention, a hybrid clock and data recovery (CDR) circuit includes a phase selection circuit (PSC) for generating a sampling signal having a frequency and a phase. The hybrid CDR circuit also has a voltage controlled oscillator (VCO) connected to the PSC for generating a clock signal. The clock signal controls the frequency of the sampling signal. The CDR circuit also includes a phase adjustment signal generator connected to the PSC for generating a phase adjustment signal. The phase adjustment signal controls the phase of the sampling signal.

The phase adjustment signal generator may be a digital loop filter. The CDR circuit may also include one or more data detectors for sampling an input signal to the CDR circuit. The CDR circuit can also include one or more phase detectors for sampling the phase of the input signal. The CDR circuit can also have at least one decimation stage to enable clock and data recovery processing to occur at a lower data rate relative to the data rate that the CDR circuit normally operates at. A decimation stage includes a digital decimation filter and a downsampling module.

In one embodiment, the phase adjustment signal generator further includes a first integrator connected to an encoder for generating the phase adjustment signal. The first integrator further includes a clipping adder and a latch.

In one embodiment, the phase adjustment signal generator further includes a second integrator connected to a digital to analog converter for transmitting an input signal to the VCO. The second integrator may include a clipping adder and a latch.

These and other advantages of the invention will be apparent to those of ordinary skill in the art by reference to the following detailed description and the accompanying drawings.

DETAILED DESCRIPTION

Figure 1:
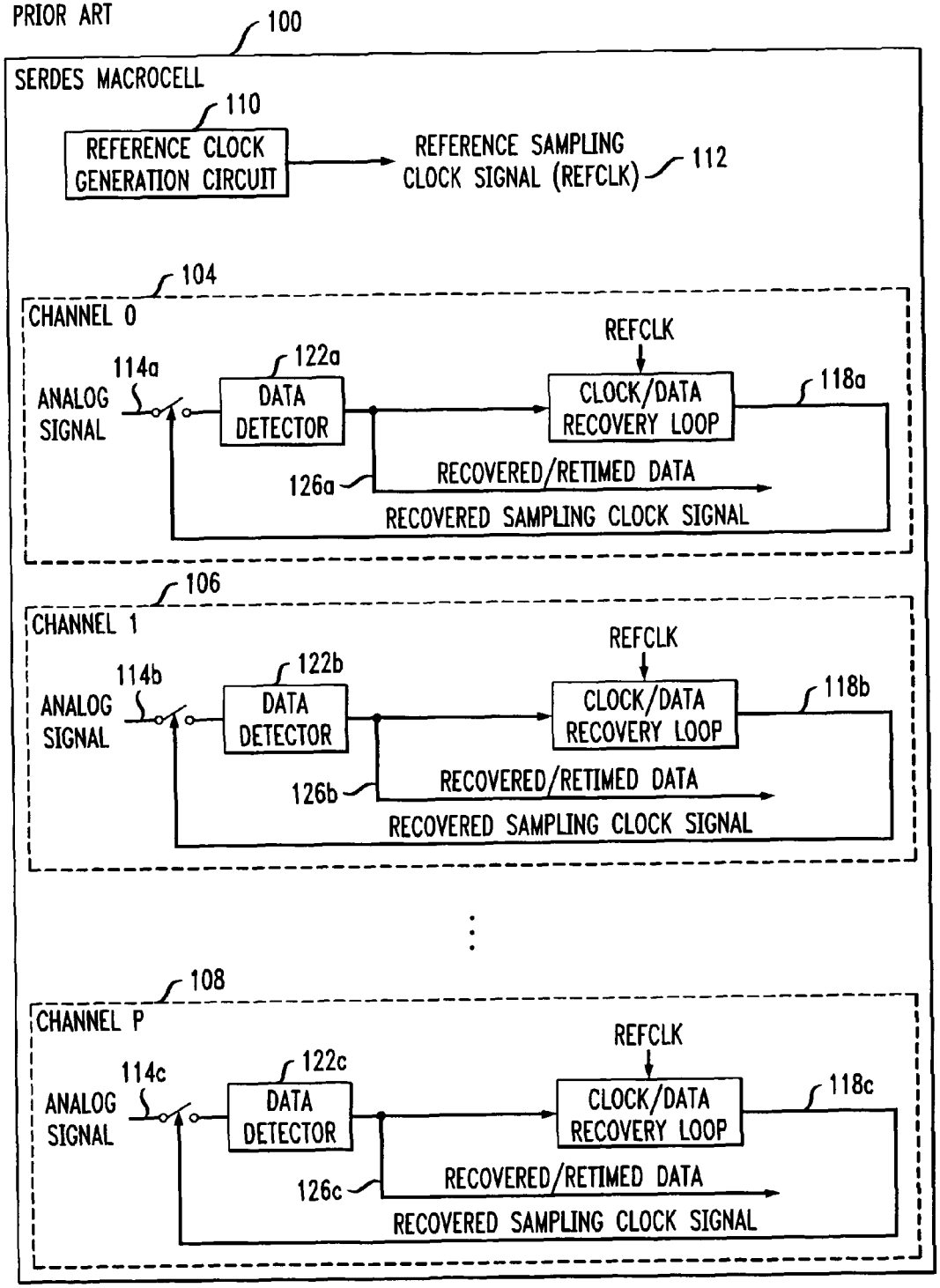
FIG. 1 is a prior art serializer/deserializer communication macrocell having several clock and data recovery (CDR) circuits.
Figure 2:
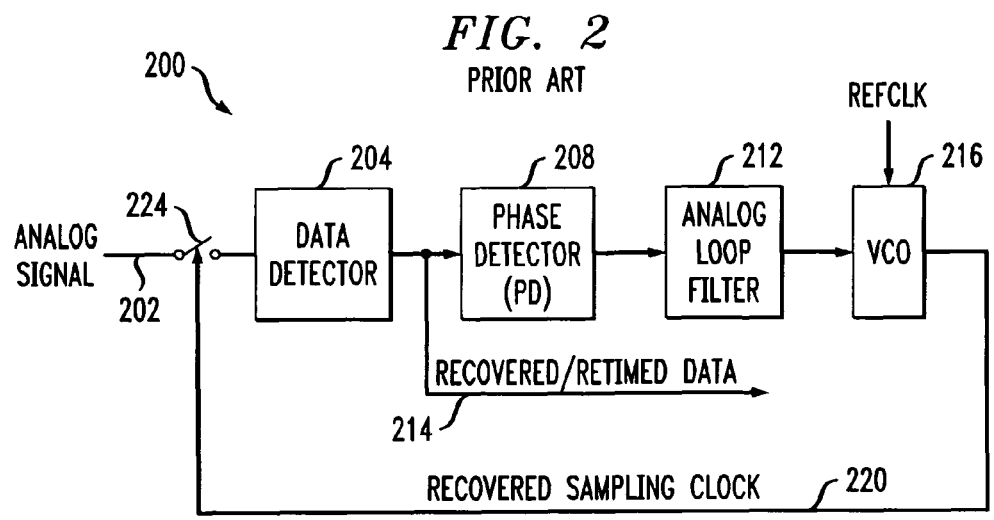
FIG. 2 is a block diagram of a prior art CDR circuit having a voltage controlled oscillator (VCO) that adjusts the phase of its output signal.
Figure 3:
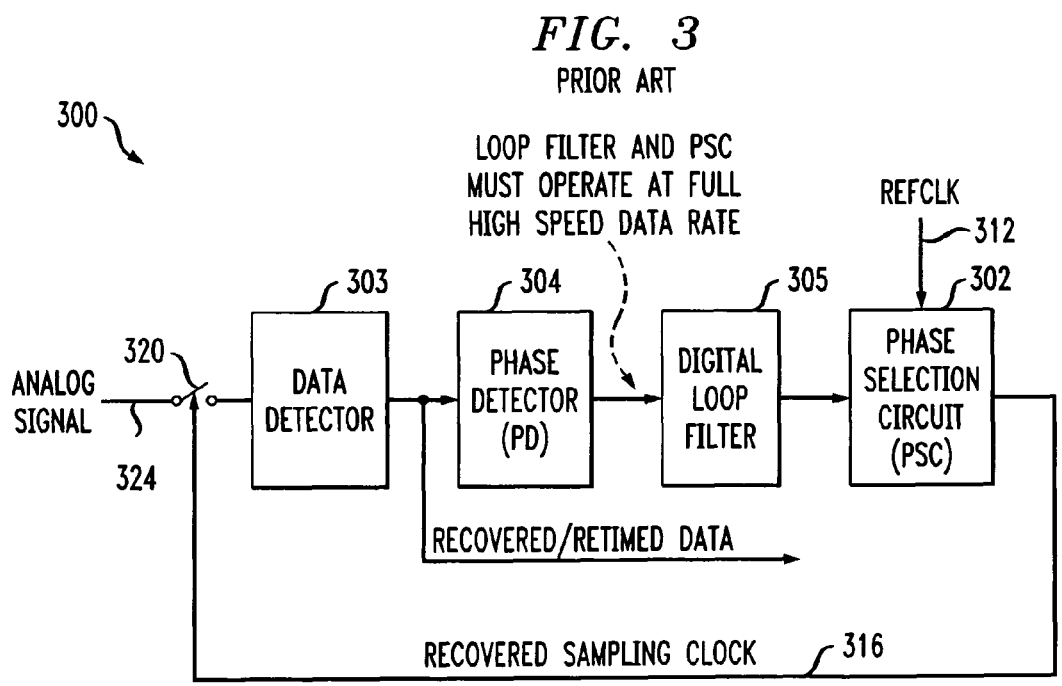
FIG. 3 is a block diagram of a prior art CDR circuit having a phase selection circuit (PSC) that adjusts the phase of its output signal.
Figure 4:
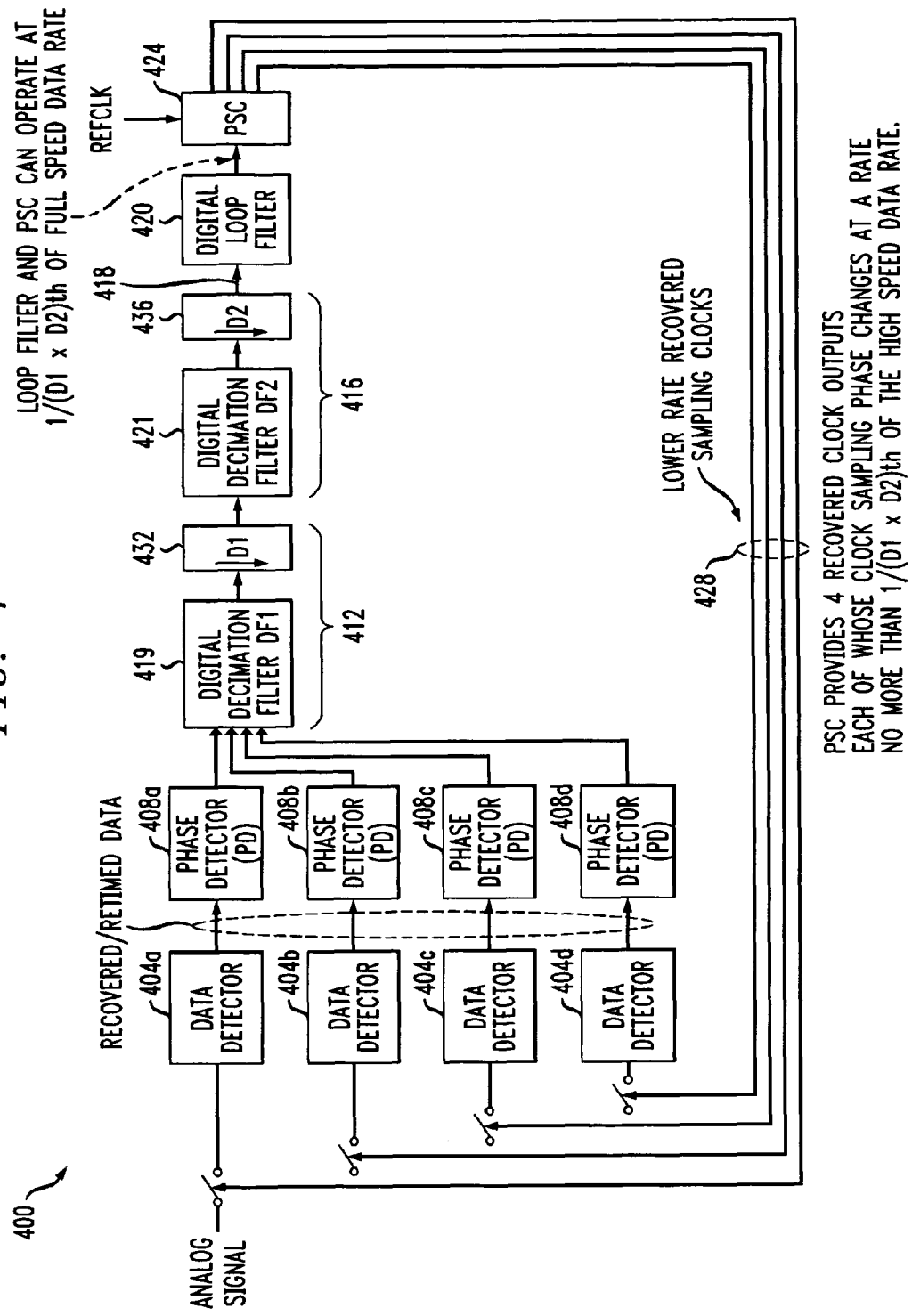
FIG. 4 is a detailed block diagram of a CDR circuit having decimation states and a digital loop filter.

The components of a CDR typically operate at high speeds. To reduce the speed at which the CDR components operate, a CDR circuit may be decimated and "parallel sampled". FIG. 4 shows a block diagram of a parallel sampled, decimated circuit 400. A circuit is "parallel sampled" when multiple data detectors and multiple phase detectors are used to sample the analog signal. CDR circuit 400 includes four data detectors 404a, 404b, 404c, 404d and four phase detectors 408a, 408b, 408c, 408d. Each data detector and each phase detector operate at one fourth of the rate at which one data detector and one phase detector would normally operate (i.e., the baud rate). The sampling signal for each data detector has a phase offset relative to one another. This reduction in the speed at which components of the CDR circuit 400 operate results in a reduction in power consumed by the components of the CDR circuit 400.

An example of a parallel sampled decimated CDR circuit is in commonly assigned patent application having Ser. No. 10/965,138, filed on Oct. 14, 2004 and titled "Incommensurately Decimated Digital Loop Filter for Clock and Data Recovery (CDR)", which is incorporated herein by reference.

The phase detectors 408 are connected to two decimation stages 412, 416. The process of decimation involves discarding samples of the input signals so that data can be processed at a lower rate of speed in the digital loop filter 420 (where complex high resolution fixed point signed arithmetic operations often take place). Typically, before discarding samples, they are processed by the decimation filter to minimize the information loss from the phase detectors 408a-408d. The process of discarding samples is called downsampling and the overall process of decimation filtering and downsampling is called decimation. Downsampling by a factor of D1 (shown with block 432) occurs after decimation filter 419. In one embodiment, the first decimation factor D1=4 as represented as 432. As a result, there are four data detectors and four phase detectors processing the first stage data. Similarly, downsampling by a factor of D2 (as represented at 436) occurs after decimation filter 421. As a result, only one out of every D1×D2 high speed samples is retained and processed by the digital loop filter 420. The output of the loop filter 420 is followed by a PSC 424 to perform the actual phase change to the sampling clocks.

Figure 5:
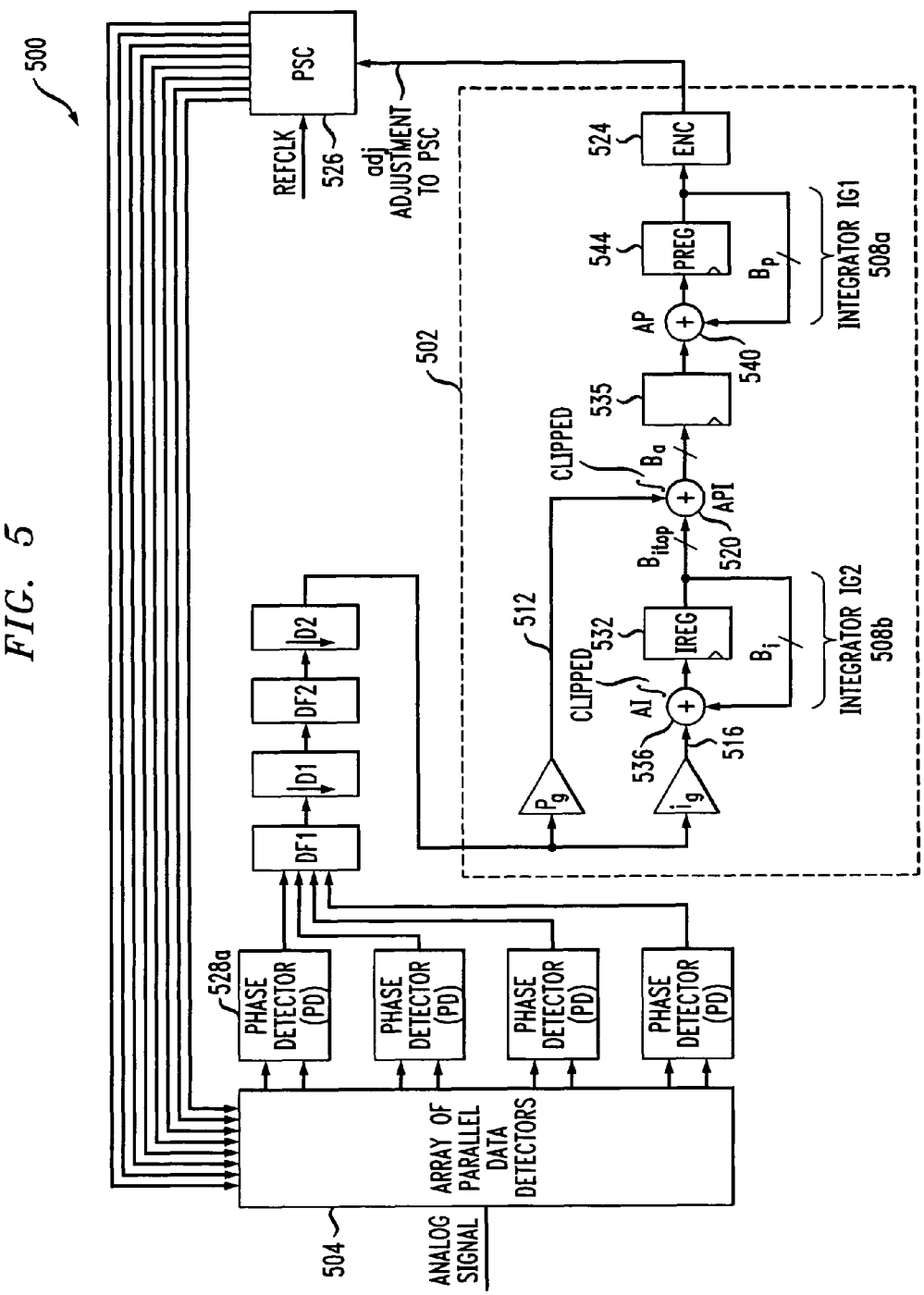
FIG. 5 is a detailed block diagram of a digital loop filter of a CDR circuit.

FIG. 5 is a block diagram of a CDR circuit 500 showing details of a digital loop filter 502. FIG. 5 shows another architecture in which two input signals are transmitted to each phase detector (e.g., phase detector 528a) (as is the case in a bang-bang phase detector). The data detectors are shown in FIG. 5 as one block representing an array 504 of parallel data detectors. Furthermore, although FIG. 4 shows one input signal transmitted into each phase detector (e.g., phase detector 408a), there may be multiple input signals transmitted into each phase detector.

The digital loop filter 502 is a second-order filter and includes two sub-filters making use of a first integrator IG1 508a and a second integrator IG2 508b. Each integrator 508a, 508b is essentially an accumulator and has a transfer function of $$\frac{z^{-1}}{1-z^{-1}}.$$

The digital loop filter 502 is a control loop having a proportional path sub-filter 512 and an integral path sub-filter 516. The proportional path (having gain $p_g$) output and integral path (having gain $i_g$) output are added via adder API 520 before being integrated by the first integrator IG1 508a.

In more detail, the second integrator 508b includes a delay cell 532 and a clipping adder AI 536. The delay cell 532 represents the latency associated with the second integrator 508b. The delay cell 535 represents the latency associated with adder API 520. If the clipping adder AI 536 is set at a digital representation of a −14 and has a minimum of −16, the clipping adder AI 536, for example, clips the output at −16 if it receives an input to add −10 to −14.

The first integrator 508a, however, has a roll around adder AP 540. The adder AP 540, therefore, transitions to its positive range when the adder AP 540 receives an input that moves the adder AP 540 beyond its minimum negative value. Similarly, the adder AP 540 transitions to its negative range when the adder AP 540 receives an input that moves the adder AP 540 beyond its maximum positive value. The first integrator 508a also has a delay cell PREG 544 which represents the latency of the first integrator 508a.

The output of the first integrator IG1 508a is encoded via encoder 524 to produce a phase adjustment which is performed through a PSC 526. The encoder 524 maintains the correct phase direction despite the "roll around" of the roll around adder AP 540.

The CDR circuit 500 has latency due to a variety of factors. For example, the circuit 500 has added latency because it is operating in the digital domain. Also, as the CDR circuit 500 is decimated, the circuit components such as the integrators 508a, 508b operate at a lower speed relative to the speed they otherwise operate at. As a result of this decimation, the circuit 500 has even more latency.

Figure 6A:
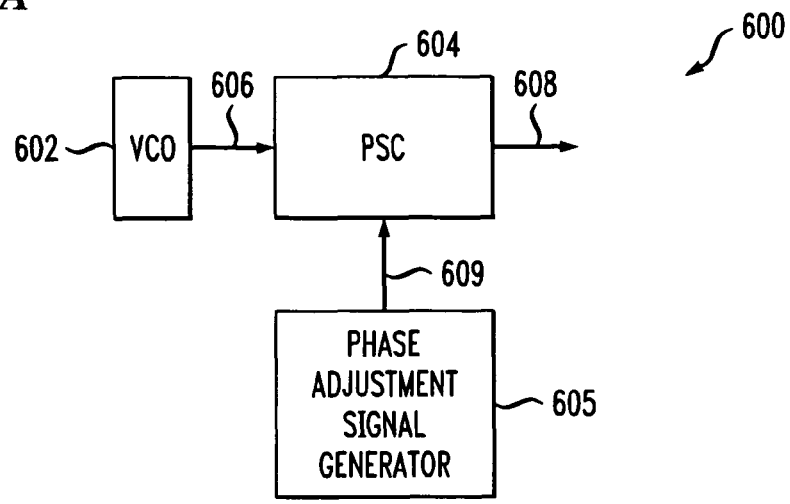
FIG. 6A is a block diagram of a PSC communicating with both a phase adjustment signal generator and a VCO in accordance with an embodiment of the present invention.

FIG. 6A shows a high level block diagram of a CDR circuit 600 in accordance with an embodiment of the present invention. The CDR circuit 600 includes a VCO 602 connected to a PSC 604. The PSC 604 is also connected to a phase adjustment signal generator 605. In one embodiment, the phase adjustment signal generator 605 is a digital loop filter. Further, the phase adjustment signal generator 605 may provide the input (not shown) to the VCO 602.

In this "hybrid" approach of using both a VCO 602 and a PSC 604, the CDR circuit 600 performs a portion of the sampling phase update through VCO 602 and a portion through PSC 604. In particular, the VCO 602 generates a clock signal 606 and transmits the clock signal 606 to the PSC 604. The clock signal 606 adjusts the frequency of output signal 608 of the PSC 604.

The phase adjustment signal generator 605 generates a phase adjustment signal 609. The phase adjustment signal 609 adjusts the phase of the output signal 608 of the PSC 604. Thus, the frequency and phase of the output signal 608 of the PSC 604 are being adjusted by the VCO 602 and the phase adjustment signal generator 605, respectively. This hybrid approach reduces the latency typically required in a CDR circuit 600 to generate the output signal 608 of the PSC 604.

Figure 6C:
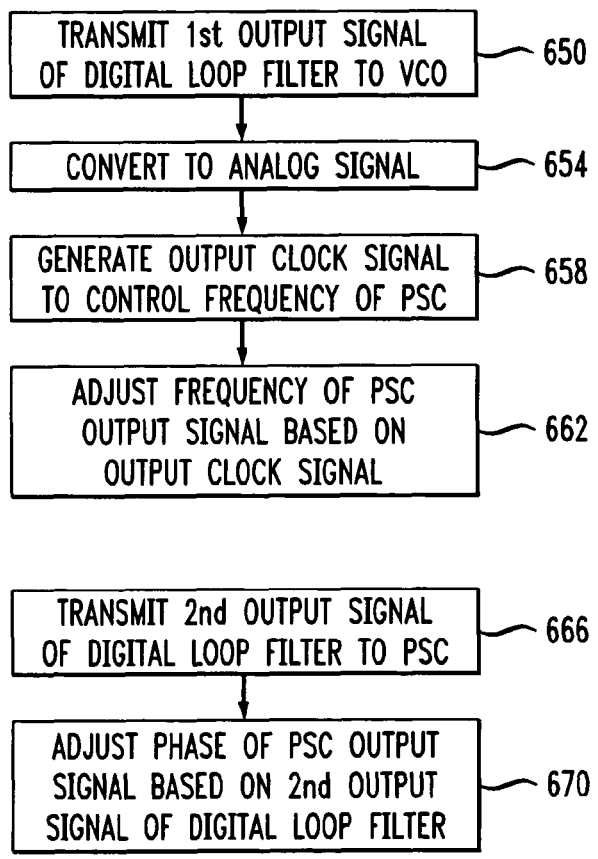
FIG. 6C shows a flowchart of the steps performed by a CDR circuit to adjust the frequency and phase of an output signal of a PSC in accordance with an embodiment of the present invention.
Figure 6B:
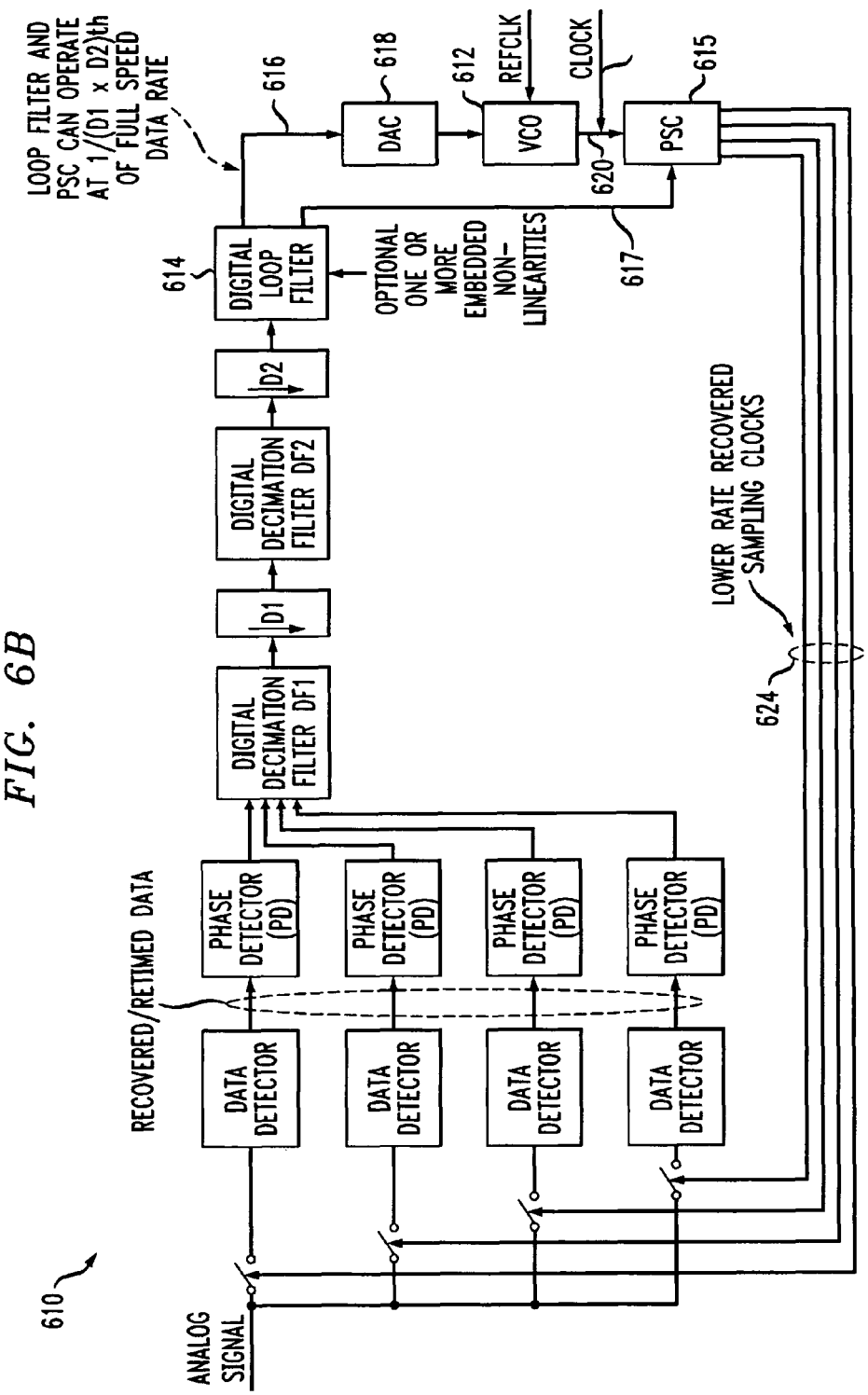
FIG. 6B is a more detailed block diagram of a CDR circuit having a VCO and a digital loop filter communicating with a PSC in accordance with an embodiment of the present invention.

FIG. 6B shows a more detailed block diagram of a CDR circuit 610 using the hybrid approach of a PSC and a VCO based architecture. As described with respect to FIG. 6A, the CDR circuit 610 performs a portion of the sampling phase update through VCO 612 and a portion through PSC 615.

In particular, digital loop filter 614 outputs two signals 616, 617. Signal 616 performs timing changes in the VCO 606 while signal 617 performs timing changes in the PSC 610. Signal 616 is converted to an analog voltage using a digital to analog converter (DAC) 618. DAC 618 then controls the VCO output clock frequency. The other signal 617 transmitted to the PSC 610 controls the PSC output clock phase. It should be noted that the PSC 610 receives as its input clock signal the VCO clock signal 620 instead of a reference clock signal as is typically the case in a pure PSC-based architecture.

FIG. 6C shows the steps performed by the hybrid CDR circuit to reduce the latency in the CDR circuit. The digital loop filter 614 transmits a first output signal 616 to the VCO 612 in step 650. The D/A converter 618 converts the digital signal into an analog representation for input into the VCO 612 in step 654. The VCO 612 then generates an output clock signal 620 to control the frequency of the PSC 615 in step 658. The output clock signal 620 transmitted from the VCO 612 adjusts the frequency of the PSC output signals 624 in step 662.

The digital loop filter 614 also transmits its second output signal 617 to the PSC 615 to control the phase of the output signals 624 of the PSC in step 666. The phase of the PSC output signals 624 is adjusted based on the second output signal 617 in step 670. It should be noted that steps 650-662 and steps 666-670 may or may not be performed sequentially.

Figure 7:
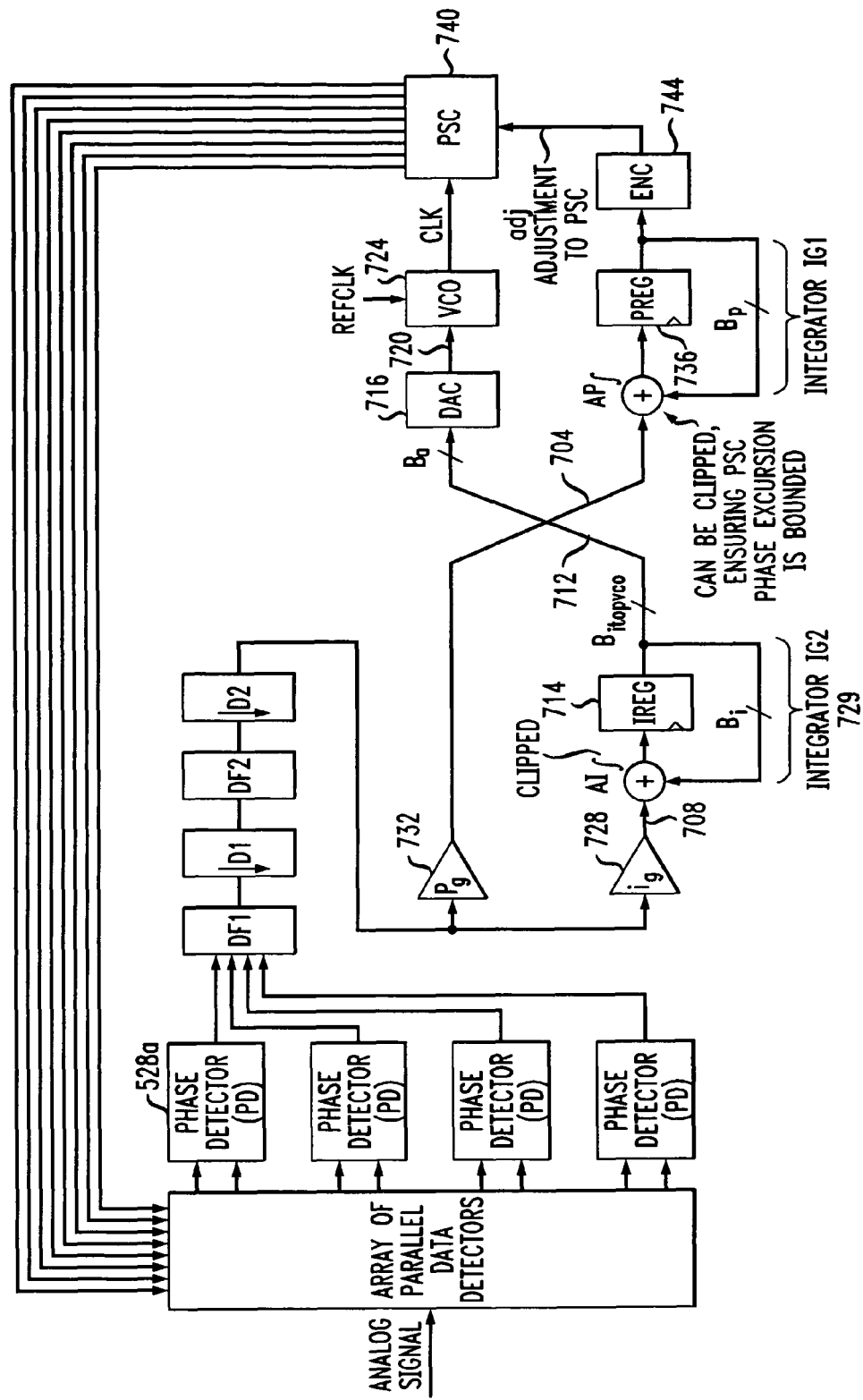
FIG. 7 is a more detailed block diagram of an integral path and a proportional path communicating with a VCO and a PSC in accordance with an embodiment of the present invention.

FIG. 7 shows a more detailed block diagram of a CDR circuit 700 using the hybrid approach of a PSC and VCO based architecture. The proportional path 704 and the integral path 708 are split up into separate paths. The proportional path 704 controls the phase of the CDR circuit output while the integral path 708 controls the frequency of the CDR circuit output.

The most significant bits (MSBs) of the intermediate integral loop output signal 712, which is the signal output of the register IREG 714, drives DAC 716. Output signal 720 transmitted by the DAC 716 is an analog voltage that controls the output clock frequency of VCO 724. The integral path 708 has one integrator 729, and the VCO 724 models the transfer function of an integrator.

The proportional path register PREG 736 controls the phase adjustments through the PSC 740. An optional encoder 744 may be required to convert the PREG value into an adjustment.

The hybrid PSC/VCO based circuit reduces loop latency because of two reasons. First, the proportional and integral paths 704, 708 are no longer added by a digital adder that runs at a decimated rate of 1/Dth of the data rate. This removes a source of latency with respect to both the proportional and integral paths 704, 708. Second, in a pure VCO architecture, the PSC typically must have a range of more than ±0.5T, where T is the baud period, to accommodate frequency offsets. Thus, the PSC changes its phase across many baud periods. PSC architectures capable of doing this at high speeds often require additional pipeline latency.

Using the present hybrid approach, however, the VCO 724 can contribute to changing its frequency to accommodate frequency offset. Therefore, the output of the proportional path register PREG 736 can be clipped to limit the phase adjustments to the PSC 740 to ±0.5T. Such a limited range PSC 740 is often easier to design because the PSC 740 does not have to perform a wraparound as is typically the case. This results in a lower latency for the proportional path 704. The integral path 708 does not experience any latency from the PSC 740. This typically makes the PSC analog circuitry less sensitive to analog errors and easier to design.

Although the figures show a particular number of data detectors, phase detectors, and clocks, any number of data detectors, phase detectors, and clocks can be used in the hybrid VCO/PSC circuit approach. Further, any number of sub-filters can be used for the second order digital CDR loop filter. In one embodiment, there is no decimation filtering and downsampling in one or more of the sub-filters. Although each sub-filter is described above as including an integrator having a transfer function of $$\frac{z^{-1}}{1-z^{-1}}.$$

each sub-filter may alternatively have other components with other transfer functions, such as including a differentiator having a transfer function of $1-cz^{-1}$ or an integrator having a transfer function of $$\frac{z^{-1}}{1-cz^{-1}},$$

Moreover, the combination of decimation filters and the downsampling operation can be implemented in many ways, such as variations of multi-stage decimation and the use of different types of filters such as FIR filters or IIR filters or accumulate-and-dump filters.

Further, the CDR architecture can be used in conjunction with any one of a variety of types of data detectors, such as a slicer, sequence detector, or digital feedback equalizer. Similarly, the CDR architecture can be used in conjunction with any one of a variety of types of phase detectors, such as a bang-bang phase detector, linear phase detector, slope table based phase detector, or a Hogge phase detector.

Additionally, the gains $p_g$ and $i_g$ can be time varying during operation based on some predetermined gain change schedule instead of being fixed. In one embodiment, the CDR loop can achieve more optimal performance with the time varying gains. Also, the loop filter may employ look ahead techniques, such as described in commonly assigned patent application having Ser. No. 11/029,977, filed on Jan. 5, 2005 and titled "Look Ahead Digital Loop Filter for Clock and Data Recovery", which is incorporated herein by reference. The PSC can also have a clipped range other than ±0.5T.

The foregoing Detailed Description is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that various modifications may be implemented by those skilled in the art without departing from the scope and spirit of the invention. Those skilled in the art could implement various other feature combinations without departing from the scope and spirit of the invention.

The invention claimed is:

1. A clock and data recovery (CDR) circuit for recovery of an input analog signal, comprising:
    at least two data detectors to receive in parallel said input analog signal, each of said detectors to detect samples of said analog signal and to produce a data detector output;
    at least two phase detectors, wherein each of said at least two phase detectors corresponds to one of said at least two data detectors, said phase detectors to receive as inputs the data detector outputs and to produce phase detector outputs;
    a phase selection circuit (PSC) for generating a sampling signal used to obtain said samples, said sampling signal comprising frequency and phase, wherein said sampling signal for each of said at least two data detectors have a phase offset relative to one another;
    a voltage controlled oscillator (VCO) connected to said PSC for generating a clock signal, said clock signal controlling said frequency of said sampling signal; and
    a phase adjustment signal generator connected to said PSC for generating a phase adjustment signal, said phase adjustment signal controlling said phase of said sampling signal.

2. The clock and data recovery circuit of claim 1 wherein said phase adjustment signal generator comprises a digital loop filter.

3. The clock and data recovery circuit of claim 1 wherein a plurality of said data detectors sample said input signal to said CDR circuit using said output signal of said CDR circuit.

4. The clock and data recovery circuit of claim 3 wherein a plurality of said phase detectors for sampling a phase of an output signal of said plurality of data detectors.

5. The clock and data recovery circuit of claim 1 further comprising at least one decimation stage to enable clock and data recovery processing at a lower data rate.

6. The clock and data recovery circuit of claim 5 wherein said at least one decimation stage further comprises a digital decimation filter and a downsampling module.

7. The clock and data recovery circuit of claim 1 wherein said phase adjustment signal generator comprises a first integrator connected to an encoder for generating said phase adjustment signal.

8. The clock and data recovery circuit of claim 7 wherein said first integrator comprises a clipping adder and a latch.

9. The clock and data recovery circuit of claim 8 wherein said phase adjustment signal generator comprises a second integrator connected to a digital to analog converter for transmitting an input signal to said VCO.

10. The clock and data recovery circuit of claim 9 wherein said second integrator further comprises a clipping adder and a latch.

11. A method for performing clock and data recovery (CDR) for an input analog signal, comprising:
    sampling said input analog signal in parallel using at least two data detectors, each of said detectors detecting samples of said analog signal and producing a data detector output;
    receiving said data detector outputs at at least two phase detectors, wherein each of said at least two phase detectors corresponds to one of said at least two data detectors, said phase detectors producing phase detector outputs;
    generating a sampling signal used to obtain said samples, said sampling signal comprising frequency and phase, wherein said sampling signal for each of said at least two data detectors have a phase offset relative to one another;
    generating a clock signal for controlling said frequency of said sampling signal; and
    generating a phase adjustment signal for controlling said phase of said sampling signal.

12. The method of claim 11 wherein said generating of said clock signal further comprises generating said clock signal using a digital loop filter.

13. The method of claim 11 further comprising receiving a reference clock signal.

14. The method of claim 11 wherein said sampling step further comprises sampling said input signal using said data detectors and said sampling signal.

15. The method of claim 14 further comprising sampling a phase of an output signal of said data detector using said phase detectors.

16. The method of claim 11 further comprising clipping of said phase adjustment signal.

17. The method of claim 11 further comprising using a phase selection circuit to generate said sampling signal.

18. The method of claim 11 further comprising using a voltage controlled oscillator to generate said clock signal.

19. The method of claim 11 further comprising using a phase adjustment signal generator to generate said phase adjustment signal.

20. An apparatus for performing clock and data recovery (CDR) for an input analog signal, comprising:
    means for sampling said input analog signal in parallel using at least two data detectors, each of said detectors detecting samples of said analog signal and producing a data detector output;
    means for receiving said data detector outputs at at least two phase detectors, wherein each of said at least two phase detectors corresponds to one of said at least two data detectors, said phase detectors producing phase detector outputs;
    means for generating a sampling signal used to obtain said samples, said sampling signal comprising frequency and phase, wherein said sampling signal for each of said at least two data detectors have a phase offset relative to one another;
    means for generating a clock signal for controlling said frequency of said signal; and
    means for generating a phase adjustment signal for controlling said phase of said signal.

21. The apparatus of claim 20 wherein said means for generating said clock signal further comprises means for generating said clock signal using a digital loop filter.

22. The apparatus of claim 20 further comprising means for transmitting a reference clock signal as an input signal to said VCO.

23. The apparatus of claim 20 wherein said means for sampling said input analog signal to said CDR apparatus uses said data detectors and said sampling signal.

24. The apparatus of claim 23 wherein said phase detectors sample a phase of an output signal of said data detectors.

25. The apparatus of claim 20 further comprising means for clipping said phase adjustment signal.

* * * * *